(12) United States Patent
Fujino et al.

(10) Patent No.: US 10,658,284 B2
(45) Date of Patent: May 19, 2020

(54) SHAPED LEAD TERMINALS FOR PACKAGING A SEMICONDUCTOR DEVICE FOR ELECTRIC POWER

(71) Applicant: Mitsubishi Electric Corporation, Chiyoda-ku, Tokyo (JP)

(72) Inventors: Junji Fujino, Tokyo (JP); Mikio Ishihara, Tokyo (JP); Masayoshi Shinkai, Tokyo (JP); Hiroyuki Harada, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/124,489

(22) PCT Filed: May 15, 2015

(86) PCT No.: PCT/JP2015/063993
§ 371 (c)(1),
(2) Date: Sep. 8, 2016

(87) PCT Pub. No.: WO2015/178296
PCT Pub. Date: Nov. 26, 2015

(65) Prior Publication Data
US 2017/0018495 A1   Jan. 19, 2017

(30) Foreign Application Priority Data

May 20, 2014 (JP) .................................. 2014-103985

(51) Int. Cl.
*H01L 23/498* (2006.01)
*H01L 25/18* (2006.01)
(Continued)

(52) U.S. Cl.
CPC ........ *H01L 23/49861* (2013.01); *H01L 23/28* (2013.01); *H01L 23/3121* (2013.01);
(Continued)

(58) Field of Classification Search
CPC .............. H01L 23/49861; H01L 23/28; H01L 23/3121; H01L 23/48; H01L 23/49838;
(Continued)

(56) References Cited

U.S. PATENT DOCUMENTS 4,784,972 A * 11/1988 Hatada ................ H01L 23/4822
228/180.21
5,110,761 A * 5/1992 Kalfus .............. H01L 23/49562
228/123.1
(Continued)

FOREIGN PATENT DOCUMENTS

DE   10 2005 039 940 B4   7/2009
DE   11 2012 005 746 T5   10/2014
(Continued)

OTHER PUBLICATIONS

Office Action (Notification of Reason for Refusal) dated Dec. 6, 2016, by the Japanese Patent Office in corresponding Japanese Patent Application No. 2016-521067 and English translation of the Office Action. (7 pages).
(Continued)

*Primary Examiner* — Brigitte A Paterson
(74) *Attorney, Agent, or Firm* — Buchanan Ingersoll & Rooney PC

(57) ABSTRACT

Herein provided are: a ceramic board; a semiconductor element for electric power, on one surface of which an electrode is formed, and the other surface of which is bonded to the ceramic board; a lead terminal, one end side of which is bonded to the electrode, and the other end side of which is to be electrically connected to an outside thereof; and a
(Continued)

sealing member by which the semiconductor element for electric power is sealed together with a part, in the lead terminal, bonded to the electrode; wherein, near an end in said one end side of the lead terminal, an inclined surface is formed which becomes farther from the circuit board as it becomes closer to the end.

5 Claims, 6 Drawing Sheets

(51) Int. Cl.
  H01L 25/07   (2006.01)
  H01L 23/28   (2006.01)
  H01L 23/48   (2006.01)
  H01L 23/00   (2006.01)
  H01L 23/31   (2006.01)
  H01L 23/373  (2006.01)
(52) U.S. Cl.
  CPC ........ *H01L 23/48* (2013.01); *H01L 23/49838* (2013.01); *H01L 23/49866* (2013.01); *H01L 23/49894* (2013.01); *H01L 24/33* (2013.01); *H01L 24/37* (2013.01); *H01L 24/40* (2013.01); *H01L 25/07* (2013.01); *H01L 25/18* (2013.01); *H01L 23/3735* (2013.01); *H01L 23/49811* (2013.01); *H01L 24/48* (2013.01); *H01L 2224/05553* (2013.01); *H01L 2224/32225* (2013.01); *H01L 2224/32245* (2013.01); *H01L 2224/33181* (2013.01); *H01L 2224/37147* (2013.01); *H01L 2224/37599* (2013.01); *H01L 2224/40139* (2013.01); *H01L 2224/45015* (2013.01); *H01L 2224/45124* (2013.01); *H01L 2224/45144* (2013.01); *H01L 2224/45147* (2013.01); *H01L 2224/45565* (2013.01); *H01L 2224/45624* (2013.01); *H01L 2224/48091* (2013.01); *H01L 2224/48106* (2013.01); *H01L 2224/48175* (2013.01); *H01L 2224/48472* (2013.01); *H01L 2224/73215* (2013.01); *H01L 2224/73221* (2013.01); *H01L 2224/73265* (2013.01); *H01L 2224/83801* (2013.01); *H01L 2224/84801* (2013.01); *H01L 2224/92247* (2013.01); *H01L 2924/00011* (2013.01); *H01L 2924/1033* (2013.01); *H01L 2924/10253* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01); *H01L 2924/17747* (2013.01); *H01L 2924/181* (2013.01)
(58) Field of Classification Search
  CPC ........... H01L 23/49894; H01L 23/4822; H01L 23/4922; H01L 23/4821
  See application file for complete search history.

(56) References Cited

U.S. PATENT DOCUMENTS

| | | | | |
|---|---|---|---|---|
| 5,798,566 | A | * | 8/1998 | Sato .................. H01L 23/367 257/703 |
| 2004/0056362 | A1 | * | 3/2004 | Moriguchi ........ H01L 23/49524 257/773 |
| 2005/0077617 | A1 | | 4/2005 | Hirano et al. |
| 2005/0161251 | A1 | * | 7/2005 | Mori .................. H01L 21/565 174/250 |
| 2010/0148298 | A1 | | 6/2010 | Takano et al. |
| 2015/0076517 | A1 | * | 3/2015 | Terai .................. H01L 24/49 257/77 |

FOREIGN PATENT DOCUMENTS

| | | |
|---|---|---|
| JP | 2004-095965 A | 3/2004 |
| JP | 2005-116875 A | 4/2005 |
| JP | 2006-351737 A | 12/2006 |
| JP | 2007-184525 A | 7/2007 |
| JP | 2007-329427 A | 12/2007 |
| JP | 2010-050364 A | 3/2010 |
| JP | 2012-079962 A | 4/2012 |
| JP | 2012-084588 A | 4/2012 |
| JP | 2013-051295 A | 3/2013 |
| JP | 2013-098199 A | 5/2013 |
| WO | WO 2013/111276 A1 | 5/2015 |

OTHER PUBLICATIONS

Office Action (Notification of Reasons for Refusal) dated Jul. 18, 2017, by the Japanese Patent Office in corresponding Japanese Patent Application No. 2016-521067 and English translation of the Office Action. (6 pages).

Office Action dated Feb. 1, 2018, by the Chinese Patent Office in corresponding Chinese Patent Application No. 201580013957.2 and English translation of the Office Action. (13 pages).

International Search Report (PCT/ISA/210) dated Aug. 4, 2015, by the Japanese Patent Office as the International Searching Authority for International Application No. PCT/JP2015/063993.

Written Opinion (PCT/ISA/237) dated Aug. 4, 2015, by the Japanese Patent Office as the International Searching Authority for International Application No. PCT/JP2015/063993.

Office Action dated Oct. 24, 2018, by the Chinese Patent Office in corresponding Chinese Patent Application No. 201580013957.2 and English translation of the Office Action. (10 pages).

Office Action dated Dec. 13, 2018, by the German Patent Office in corresponding German Patent Application No. 11 2015 002 348.8 and English translation of the Office Action. (17 pages).

Office Action (Notice of Reasons for Refusal) dated Feb. 5, 2019, by the Japanese Patent Office in corresponding Japanese Patent Application No. 2018-059440 and English translation of the Office Action. (11 pages).

Office Action dated Oct. 1, 2019, by the Japanese Patent Office in corresponding Japanese Patent Application No. 2018-059440 and English translation of the Office Action. (12 pages).

* cited by examiner

SHAPED LEAD TERMINALS FOR PACKAGING A SEMICONDUCTOR DEVICE FOR ELECTRIC POWER

TECHNICAL FIELD

The present invention relates to a semiconductor device for electric power, and in particular, relates to its structure in which a lead terminal is used for making electrical connection to a main electrode of a semiconductor element for electric power.

BACKGROUND ART

For products all over from industrial apparatuses to home electronics/information terminals, semiconductor devices for electric power are becoming widespread, and with respect to the semiconductor devices for electric power to be installed in the home electronics, they are required to have high productivity and high reliability that allow them to deal with a wide variety of products as well as to be made compact and lightweight. At the same time, they are also required to have a package configuration that is applicable to silicon carbide (SiC) semiconductors which are highly likely to go mainstream in future because of being high in operation temperature and superior in efficiency.

In semiconductor devices for electric power, because they deal with a high voltage and a large current and thus, generate a large amount of heat, there are many cases where a ceramic board that is superior in heat conductivity is used as an insulative board, in order to efficiently release the heat. Further, according to the increase in density of the aforementioned semiconductor element for electric power, a method is becoming put in use in which a copper electrode plate is directly soldered to the main electrode of the semiconductor element for electric power, in order to form a high current-density circuit.

However, a difference in linear expansion coefficient ($\alpha$) becomes larger according to the combination of an inorganic member such as the ceramic board ($\alpha$: 6 to 7 ppm/K) and a metal such as the copper electrode plate ($\alpha$: 16 ppm/K), in comparison with the combination in the case where a conventional resin-based board is instead used. Accordingly, a difference therebetween in expansion/contraction due to temperature change is large, and thus, because of a thermal stress associated with that difference, a crack or like damage is likely to occur, so that there is a risk that the long-term reliability is degraded. For that reason, there has been experimented a method like that in which the periphery of the bonded portion between the copper electrode plate and the semiconductor element is sealed with a soft urethane resin and thereafter the whole is sealed with an epoxy resin, namely, a sealing member is formed in a manner that materials of different physical properties are used differently depending on its regions, to thereby reduce the stress (see, for example, Patent Document 1).

CITATION LIST

Patent Document

Patent Document 1: Japanese Patent Application Laid-open No. 2006-351737 (Paragraphs 0020 to 0027, FIG. 1)

SUMMARY OF THE INVENTION

Problems to be Solved by the Invention

However, there is a limit in adjusting the physical property of the sealing member, so that it is difficult to mitigate the stress solely by the adjustment of the physical property. Further, when the sealing member having different physical properties depending on the regions is used as in the Patent Document, stress concentrates to a portion where the physical property changes, to induce occurrence of a crack, etc., so that there is a risk that the reliability rather decreases.

This invention has been made to solve the problem as described above, and an object thereof is to provide a semiconductor device for electric power which can deal with a large current and is highly reliable.

Means for Solving the Problems

The semiconductor device for electric power of the invention is characterized by comprising: a circuit board; a semiconductor element for electric power, on one surface of which an electrode is formed, and the other surface of which is bonded to the circuit board; a lead terminal, one end side of which is bonded to the electrode, and the other end side of which is to be electrically connected to an outside thereof; and a sealing member by which the semiconductor element for electric power is sealed together with a part, in the lead terminal, bonded to the electrode; wherein, near an end in said one end side of the lead terminal, an inclined surface is formed which becomes farther from the circuit board as it becomes closer to the end.

Effect of the Invention

According to the semiconductor device for electric power of the invention, because the inclined surface which becomes farther from the circuit board is formed near the end of the lead terminal, it is possible to reduce stress concentration to the portion bordering on the end, to thereby provide a semiconductor device for electric power which can deal with a large current and is highly reliable.

MODES FOR CARRYING OUT THE INVENTION

Embodiment 1

Figure 1A:
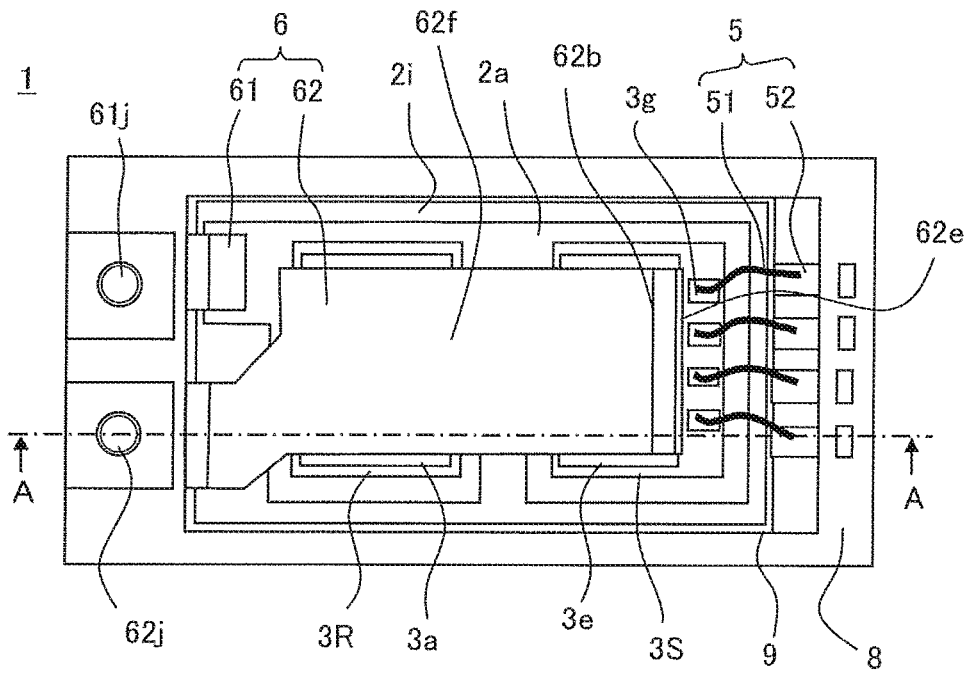
FIG. 1A and FIG. 1B are a plan view and a cross-sectional view for illustrating a configuration of a semiconductor device for electric power according to Embodiment 1 of the invention.
Figure 1B:
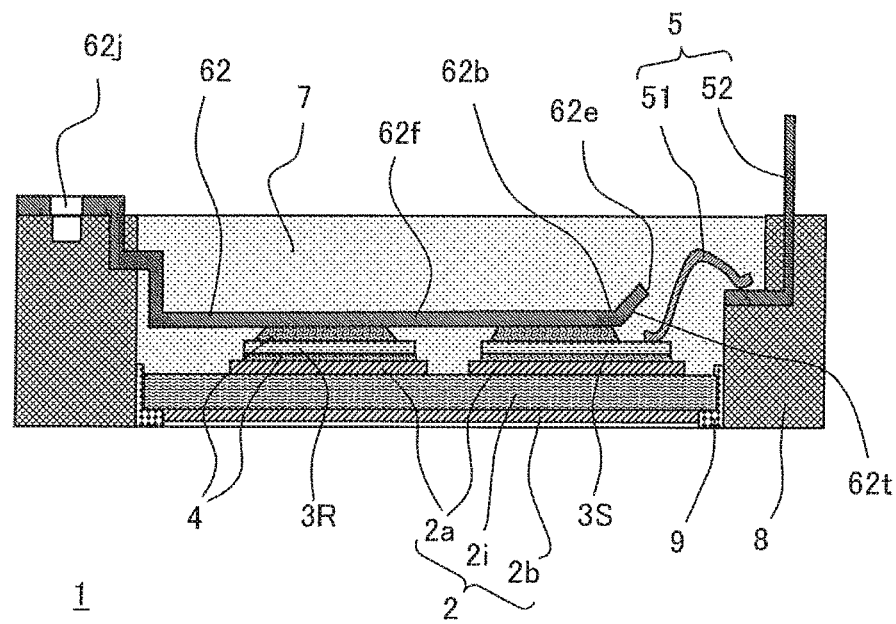
Figure 2A:
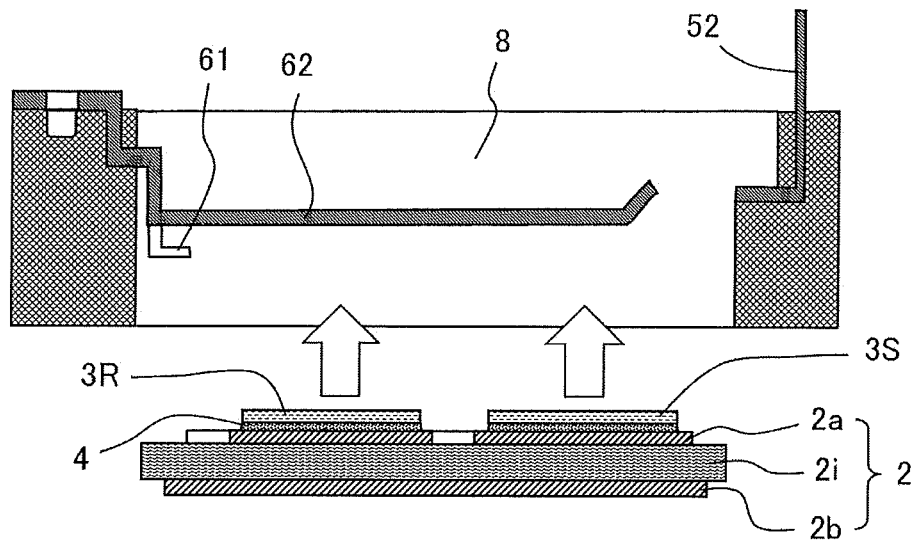
FIG. 2A, FIG. 2B and FIG. 2C are cross-sectional views, at respective steps, for illustrating a method of manufacturing the semiconductor device for electric power according to Embodiment 1 of the invention.
Figure 2B:
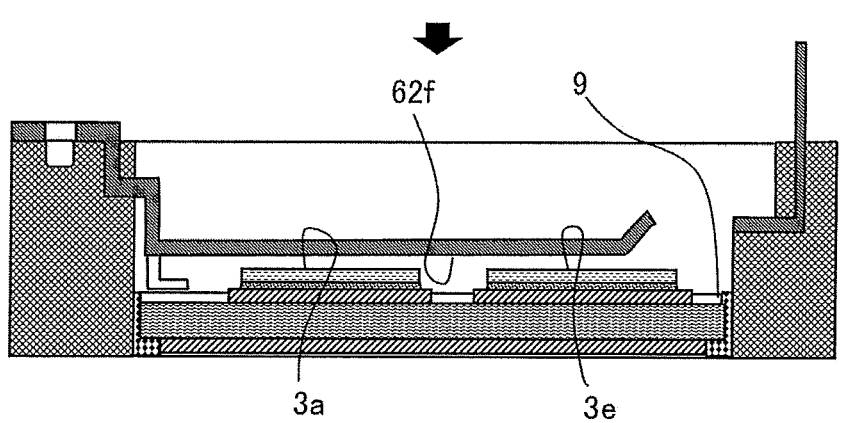
Figure 2C:
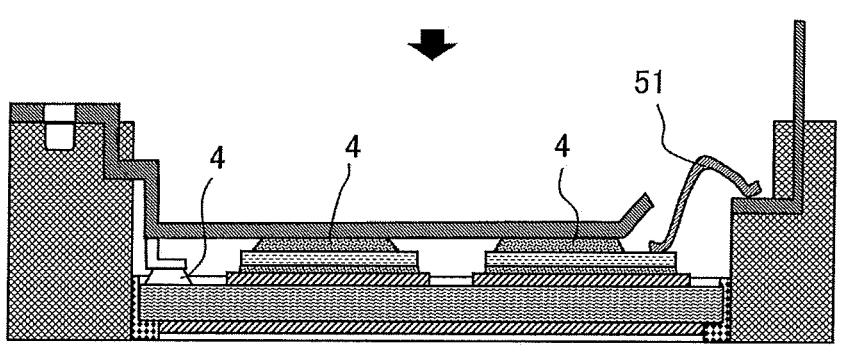
Figure 3:
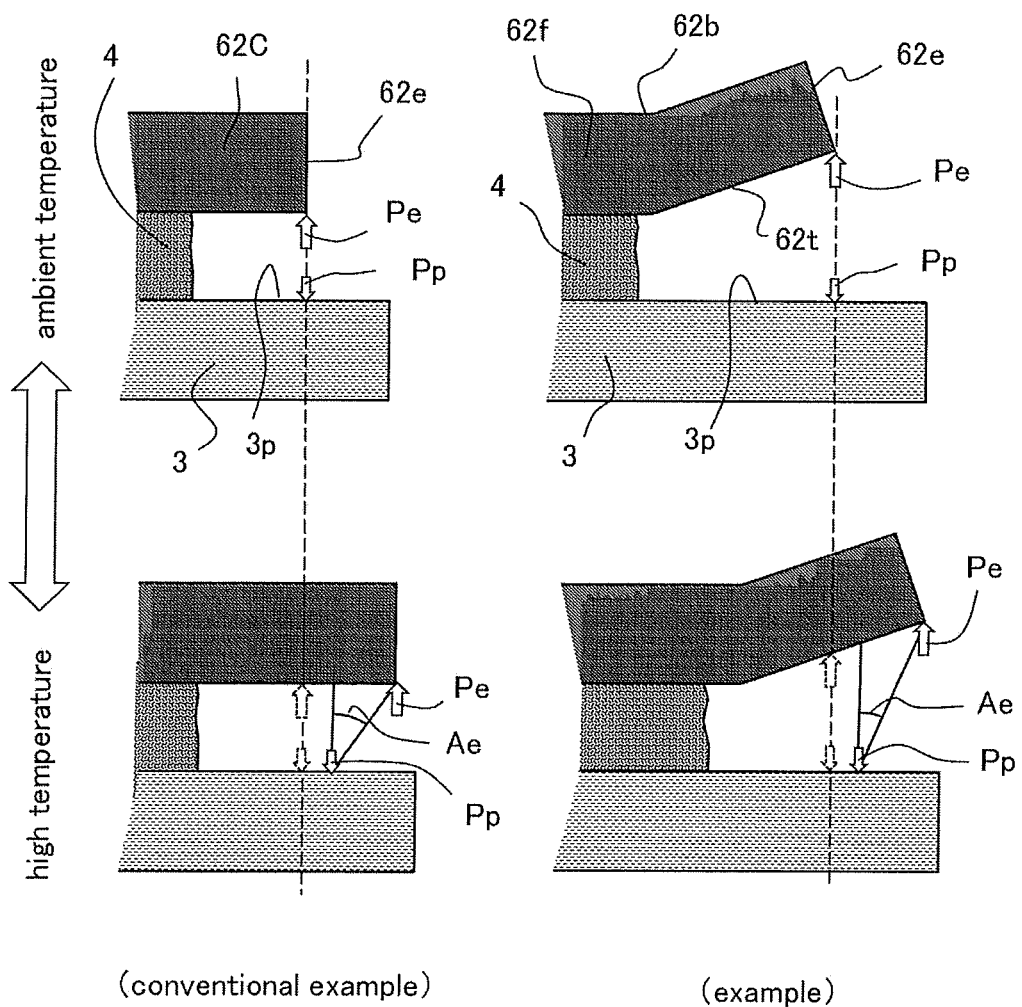
FIG. 3 is partial cross-sectional views showing respective displacements in portions near ends of leads terminals of a conventional example and an example, for illustrating a function and effect by the semiconductor device for electric power according to Embodiment 1 of the invention.

FIG. 1 to FIG. 3 are diagrams for illustrating a configuration and a manufacturing method of a semiconductor device for electric power according to Embodiment 1 of the invention, in which shown at FIG. 1A is a plan view of the semiconductor device for electric power in a state where its sealing resin is removed, and at FIG. 1B is a cross-sectional view corresponding to A-A line in FIG. 1A. Further, FIG. 2 is cross-sectional views corresponding to FIG. 1B, at respective steps, for illustrating a method of manufacturing the semiconductor device for electric power, and FIG. 3 is partial cross-sectional views showing respective displacements near ends of leads terminals, relative to semiconductor elements for electric power, in a conventional example and an example at the time a temperature change occurs from an ambient temperature to a high temperature.

Figure 4:
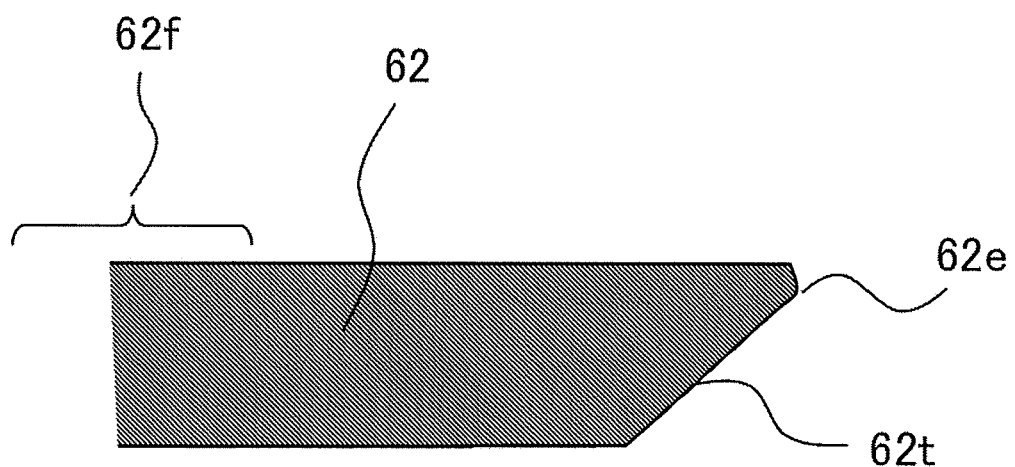
FIG. 4 is a partial cross-sectional view of an end portion of a lead terminal, for illustrating a configuration of a semiconductor device for electric power according to a modified example of Embodiment 1 of the invention.
Figure 5:
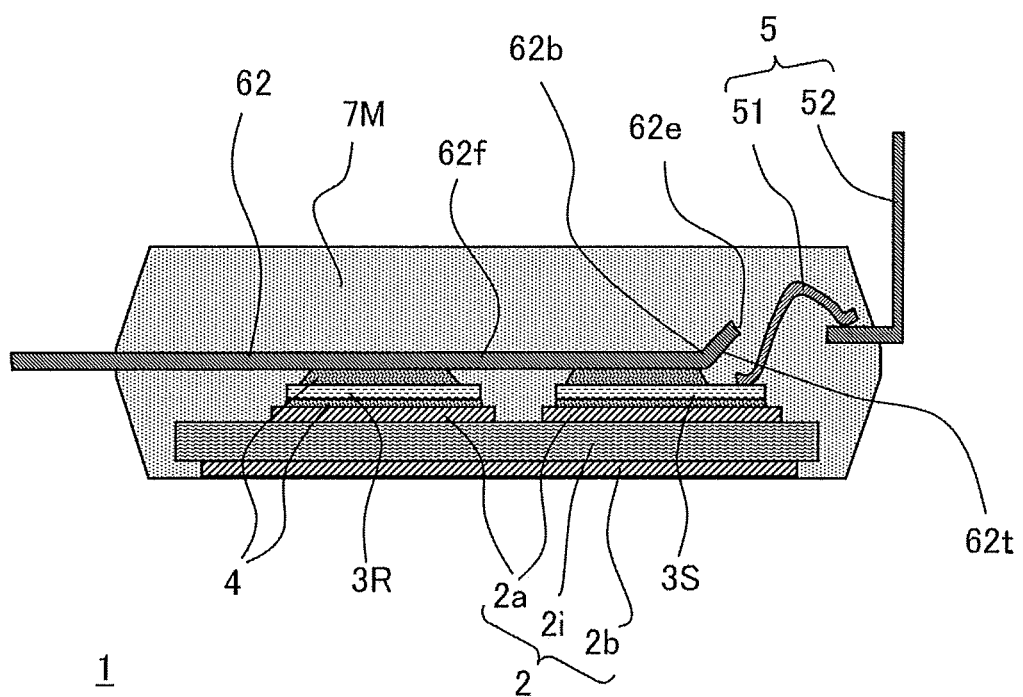
FIG. 5 is a cross-sectional view for illustrating a configuration of a semiconductor device for electric power according to a modified example of Embodiment 1 of the invention.

Further, FIG. 4 is a partial cross-sectional view of an end portion of the lead terminal, for illustrating a configuration as a first modified example in which a shape near the end of the lead terminal is changed. Furthermore, FIG. 5 is a cross-sectional view for illustrating a configuration as a second modified example in which the form of a sealing member is changed, which corresponds to A-A line in FIG. 1A.

Although the feature of the semiconductor device for electric power according to Embodiment 1 resides in a shape of the end portion of the lead terminal bonded to a main electrode of the element, description will be firstly made about a basic configuration of the semiconductor device for electric power. In a semiconductor device for electric power 1 according to Embodiment 1, as shown in FIG. 1, semiconductor elements for electric power 3 (in some cases, referred to simply as "element(s)") are die-bonded (joined) using a solder 4, to a conductive layer 2a of a ceramic board 2 that is a circuit board.

The ceramic board 2 comprises a ceramic base member 2i of 40 mm×25 mm×0.635 mm thick, which is made of aluminum nitride (AlN) and on both sides of which copper conductive layers 2a, 2b each 0.4 mm thick are formed. The semiconductor elements for electric power 3 are elements using SiC that is a wide bandgap semiconductor material, and used here are: an IGBT (Insulated Gate Bipolar Transistor) 3S that is 0.25 mm thick and forms a rectangular-plate shape of 15 mm square, as a switching element; and a diode 3R that is 0.25 mm thick and forms a rectangular-plate shape of 15 mm×15 mm, as a rectifier element.

One end-side portion of a lead terminal 62, which is a feature of this invention, is bonded to, among respective main electrodes of the semiconductor elements for electric power 3, front-side main electrodes (3a, 3e) including an emitter electrode 3e of the IGBT 3S. Further, a lead terminal 61 made of a copper plate of 8 mm wide×0.7 mm thick is bonded, using a solder 4, onto the conductive layer 2a to which back-side electrodes of the respective elements including a collector electrode 3c of the IGBT 3S are bonded.

The ceramic board 2 is positioned and fixed inside a casing 8 made of a PPS (Poly Phenylene Sulfide) resin of 48 mm×28 mm×12 mm high, using an adhesive agent 9 made of silicone so that a gap between the casing and the portion of the ceramic base member 2i is filled therewith. Note that the lead terminal 61, the lead terminal 62 and signal terminals 52 are each formed by insert molding in the casing 8, and terminal parts 61j, 62j of the lead terminal 61 and the lead terminal 62, each having a width of 10 mm and exposed from an upper portion of the casing 8 (left-upper portion in the figure), are each provided as a screw terminal. Further, one end portion (width: 1.5 mm) of the signal terminal 52 is electrically connected in the casing 8 to a gate electrode 3g, as a control electrode, of the IGBT 3S by means of a bonding wire 51 (made of aluminum: ɸ0.15 mm), and the other end portion in a pin shape is exposed from an upper portion of the casing 8 (right-upper portion in the figure).

Accordingly, a main current circuit 6 between the semiconductor elements for electric power 3 and an external circuit is formed by the lead terminal 61 and the lead terminal 62. Further, the gate electrode 3g (1 mm×2 mm) of the IGBT 3S and the like, form a signal circuit 5 connected to the outside, by means of the signal terminals 52 and the bonding wires 51. Further, the inside of the casing 8 is sealed in an insulated manner by filling a resin (sealing member 7) therein by direct potting and then curing it by heating. Note that the linear expansion coefficient of the sealing member 7 is adjusted to be an intermediate value between the linear expansion coefficient of the lead terminal 62 and the linear expansion coefficient of the ceramic board 2.

Here, in the lead terminal 62 that is a feature of the semiconductor device for electric power 1 according to Embodiment 1, an inclined surface 62t is provided which becomes farther from the ceramic board 2 and the semiconductor element for electric power 3 as it becomes closer to a longitudinal end 62e. The inclined surface 62t is formed by providing a bent portion 62b (flip-up angle: 45 degrees) at a place 2 mm before the end 62e (in the opposite side to the terminal part 62j), which is bent from the bonded portion and relative to a planar portion 62f, in the lead terminal 62, bonded to the semiconductor for electric power elements 3. Namely, with respect to the surface, in the lead terminal 62, facing to the semiconductor element for electric power 3 or the ceramic board 2, its part that is sealed by the sealing member 7 inside the casing 8 and is placed near the end 62e, is inclined so as to become farther from the semiconductor element for electric power 3 or the ceramic board 2 as it becomes closer to the end 62e (inclined surface 62t is provided).

Next, description will be made about a method of manufacturing the semiconductor device for electric power 1 according to Embodiment 1.

First, as shown in FIG. 2A, the casing 8 which is integrated with the lead terminal 61, the lead terminal 62 and the signal terminals 52, is formed by insert molding. On the other hand, to specified positions on the circuit face (in the conductive layer 2a-side) of the ceramic board 2, the semiconductor elements for electric power 3 are bonded, respectively, using the solder 4. Then, the ceramic board 2 on which the semiconductor elements for electric power 3 are mounted, is inserted into said casing 8 from its bottom side (under side in the figure).

Then, as shown in FIG. 2B, using the adhesive agent 9, the inserted ceramic board 2 is fixed to the casing 8. At this time, the adhesive agent 9 is filled in the gap between the ceramic base member 2i and the casing 8, so that, using the casing 8 and the ceramic board 2, an upwardly-open container with the ceramic board 2 as the bottom portion is formed. Further, the lead terminal 61 is facing to the conductive layer 2a with an interval of 2 mm therebetween, and the lead terminal 62 (planar portion 62f) is facing to the respective main electrodes 3a, 3e of the semiconductor elements for electric power 3 with a specified interval therebetween. Further, an unshown soldering member is each placed therebetween.

Thereafter, the above solder is reflowed by heating and then cooled, so that, as shown in FIG. 2C, bonding is done using the solder 4 between the lead terminal 61 and the conductive layer 2a and between the lead terminal and the respective main electrode 3a, 3e of the semiconductor elements for electric power 3. In addition, in the signal terminals 52, the end portions exposed inside the casing 8 are electrically connected to the control electrodes of the IGBT 3S such as, a temperature sensor electrode and the like including the gate electrode 3g, by means of the bonding wires 51.

Lastly, a resin for direct potting in a state heated to 60° C. is poured into the space partitioned by the casing 8 and the ceramic board 2, defoamed in vacuum, and then cured by heating (100° C., 1.5 hours→140° C., 1.5 hours). Accordingly, the sealing member 7 is formed as shown in FIG. 1B to thereby complete the sealing, so that the semiconductor device for electric power 1 (power module) is accomplished.

Next, description will be made about operations of the above semiconductor device for electric power 1 and a function and effect of the invention.

The ceramic board 2 comprises the ceramic base member 2i made of AlN on both sides of which the copper conductive layers 2a, 2b are formed, and thus the board has a linear expansion coefficient of approx. 10 ppm/K as a whole, whereas the lead terminal 62 made of copper has a linear expansion coefficient of 16 ppm/K. Since, due to the bent portion 62b, the inclined surface 62t is formed near the end 62e, in the sealing member 7, of the lead terminal 62, the gap between the lead terminal 62 and the element (IGBT 3S in Embodiment 1) becomes wider as it becomes closer to the end 62e. Thus, the thickness of the resin of the sealing member 7 interposed between the lead terminal 62 and the element increases gradually as the position becomes closer to the end 62e.

On the other hand, the inventors of this invention have performed many heat cycle tests with respect to a variety of samples about a semiconductor device for electric power with a combination of a ceramic board and a lead electrode. Upon analysis about those results, it is found that, in many samples, an end portion, in the sealing member, of the lead terminal bonded to the main electrodes, provides a beginning point of breakage. Namely, it is found that, with respect to the lead terminal for making electrical connection between an external circuit and the main electrode of the semiconductor element for electric power, it basically extends in a manner longitudinally traversing the area in the circuit face; however, in that lead terminal, the stress by the thermal strain concentrates to its end portion in the sealing member to thereby provide the beginning point of breakage.

However, in accordance with the semiconductor device for electric power 1 according to Embodiment 1 of the invention, since the inclined surface 62t is formed near the end 62e, its interval to the element increases gradually as the position becomes closer to the end 62e. Namely, the thickness of the sealing member 7 interposed between the objects of different linear expansion coefficients becomes thicker and thus the flexural strength becomes larger, as the position becomes closer to the end 62e. Meanwhile, when the position goes beyond the end 62e, a main-body thickness of the sealing member 7 emerges because of discontinuation of the lead terminal 62.

On the other hand, in the case of using a conventional electrode terminal, the thickness of the sealing member is uniform toward the end of the terminal without change; however, even in this case, when the position goes beyond the end 62e, a main-body thickness of the sealing member 7 emerges. In either case, at a place at which the terminal discontinues, the thickness of the sealing member 7 changes in a stepwise fashion. However, in the conventional case, a place which is near the end 62e and at which the thickness changes in the longitudinal direction, is only one point at the end 62e. In contrast, in Embodiment 1, even in the sandwiched portion by the lead terminal 62, the thickness (and the flexural strength) changes, and the places at which the thickness changes, are spread in a range (inclined surface 62t) having a length and including the end 62e. Thus, it becomes possible to mitigate concentration of the stress imposed to the sealing member 7, to the portion bordering on the end 62e, to thereby extend the lifetime.

Moreover, according to the difference in configuration, a difference occurs also in distribution of the stress. In FIG. 3, four partial cross-sectional views of portions near ends of the lead terminals are arranged vertically and horizontally, in which a conventional example is shown in the left side and an example of this invention is shown in the right side. Further, in the upper side of the figure, states at ambient temperature, namely, at the time of out of activation, are shown, and in the lower side, states at a high temperature, namely, at the time of activation are shown. In the figure, the broken lines penetrating through the upper side and the lower side, indicate a position Pe of the end 62e of a conventional lead terminal 62C and a position Pe of the end 62e of the lead terminal 62 according to the example, respectively, at ambient temperature. Further, a first intersection given in a line from the position Pe indicated by the broken line toward the semiconductor element for electric power 3, is a position Pp on a main face 3p of the element that is just beneath the end at ambient temperature.

When the device is activated from such a state, the temperature rises due to heat generation of the element, resulting in the high-temperature state shown in the lower side, and thus, both in the conventional example and the example, the positions Pe and Pp are displaced due to expansion of members to the right side in the figure. However, because of the difference in linear expansion coefficient, the end of the terminal (position Pe) goes more toward the right side than the position Pp on the main face 3p of the semiconductor element for electric power 3, so that a displacement occurs between the terminal and the element. Such a displacement itself similarly occurs either in the conventional example or the example; however, between the conventional example and the example, there is a difference in the interval (a vertical distance in the figure) between the end 62e and the element, and this results in different imposed stresses.

With reference to the position Pe at ambient temperature that is on the surface facing to the element (on the end portion in the figure), of the lead terminal (or 62C), and the position Pp just beneath it on the main face 3p of the element, the thermal stress is thought to be proportional to the magnitude of an angle Ae made by a line connecting the position Pe and the position Pp at the high temperature and a line perpendicular to the main face 3p. Thus, when the inclined surface 62t is formed as in the example, as the position becomes closer to the end 62e, the interval becomes wider, so that the angle Ae becomes smaller and thus the strain becomes smaller. Namely, the stress imposed to the portion in the sealing member 7 bordering on the end 62e becomes smaller than that in the conventional example.

Furthermore, like the change in the thickness, the change in the stress with a limit bordering on the end 62e, continues in the region where the inclined surface 62t is formed, so that it is possible to mitigate the occurrence of the beginning point of breakage from concentrating to the portion bordering on the end 62e, and as a result, to extend the lifetime until the breakage. Note that, although the above mechanism is described using the relationship between the main face 3p of the element and the lead terminal 62 in accordance with Embodiment 1, the similar description can be made even using the relationship between the circuit face of the ceramic board 2 and the lead terminal 62.

First Modified Example (Structure of Lead Terminal)

In the above example, as the method of forming the inclined surface 62t whose distance from the element becomes larger as it becomes closer to the end 62e, a case has been shown where the bent portion 62b is provided by bending the plate member; however, this is not limitative. For example, like this modified example shown in FIG. 4, the inclined surface 62t may be formed by varying the wall thickness of the portion near the end 62e, such as, by corner cutting. Even in this case, it is possible to mitigate the concentration of stress and occurrence of the beginning point to thereby extend the lifetime.

Note that, in the above example, although a case has been shown where AlN is used for the ceramic base member 2i, a similar effect is also achieved when alumina ($Al_2O_3$), silicon nitride (SiN) or the like is used. Further, although a case has been shown where copper is used for the conductive layers 2a, 2b, a similar effect is also achieved when aluminum is used. Furthermore, although a case has been shown where the solder 4 is used for the bonding between the semiconductor element for electric power 3 and the ceramic board 2, the bonding between the semiconductor element for electric power 3 and the lead terminal 62 and the bonding between the lead terminal 61 and the conductive layer 2a, a similar effect is also achieved when an electroconductive adhesive agent in which silver fillers are dispersed in an epoxy resin, or a bonding material including nanoparticles, such as of a silver nano-powder or a copper nano-powder, to be fired at a low temperature, is used.

Further, although a case has been shown where PPS is used as the material of the casing 8, when an LCP (liquid-crystal polymer) is used, further improvement in heat resistance can be expected. Further, as to the resin for direct potting used for forming the sealing member 7, even if it is of a type to be poured and cured at ambient temperature, a similar effect is achieved.

Further, in the above example, there is provided a module configuration of so-called "1-in-1" in which the diode 3R and the IGBT 3S are in a one-to-one relationship; however, even if a configuration of two pairs of "2-in-1" or six pairs of "6-in-1" is used, when the signal terminals are placed above metal plates each serving as the lead terminal, a similar effect is achieved. Further, although a case has been shown where the IGBT 3S is used as the switching element, it may instead be a MOSFET (Metal Oxide Semiconductor Field Effect Transistor), for example. Further, as the diode 3R, an element among those of a variety of types, for example, an SBD (Schottky Barrier Diode) or the like, may be used. Further, the number of elements is not limited to two, and may be more than that and may be one.

Further, with respect to the signal circuit 5, although a case has been shown where the bonding wire 51 made of aluminum is used, a similar effect is also achieved when a copper wire, an aluminum-coated copper wire or a gold wire is used. Further, a similar effect is also achieved when a bonding ribbon is used or a bus bar as an ultrasonically-bonded metal plate, or the like, is used.

Second Modified Example (Structure of Sealing Member)

In the above example, although a case has been shown where the sealing member 7 is formed by potting a resin in the casing 8, this is not limitative. For example, like this modified example shown in FIG. 5, without using the casing, a sealing member 7M (transfer mold package) may be formed by transfer molding using an unshown mold.

As described above, in accordance with the semiconductor device for electric power 1 according to Embodiment 1, it comprises: the circuit board (ceramic board 2); the semiconductor element for electric power 3, on one surface of which the electrode (for example, 3a, 3e) is formed, and the other surface of which is bonded to the circuit board; the lead terminal 62, one end side of which is bonded to the electrode, and the other end side of which is to be electrically connected to the outside thereof; and the sealing member 7 by which the semiconductor element for electric power 3 is sealed together with a part, in the lead terminal 62, bonded to the electrode; wherein, near the end 62e in said one end side of the lead terminal 62, the inclined surface 62t is formed which becomes farther from the circuit board (exactly, a surface which is facing to the circuit board and which becomes farther therefrom as it becomes closer to the end 62e). Thus, in a portion of the sealing member 7 sandwiched by the lead terminal 62, the places at which the thickness (and the flexural strength) changes, are spread in a range (inclined surface 62t) having a length and including the end 62e, so that concentration of the stress imposed to the sealing member 7, to the portion bordering on the end 62e, is mitigated. In another aspect, as the position becomes closer to the end 62e, the interval becomes wider, and the angle Ae becomes smaller and thus the strain becomes smaller, so that the stress imposed to the portion in the sealing member 7 bordering on the end 62e becomes smaller than that in the conventional case. As a result, it becomes possible to extend the lifetime even when the lead terminal 62 dealing with a large current is used.

In that case, the inclined surface 62t can be easily formed by providing, for example, the bent portion 62b near the end 62e.

Also, the inclined surface 62t can be easily formed by providing, for example, a corner cut portion so that the wall thickness becomes thinner toward the end 62e.

Embodiment 2

Figure 6:
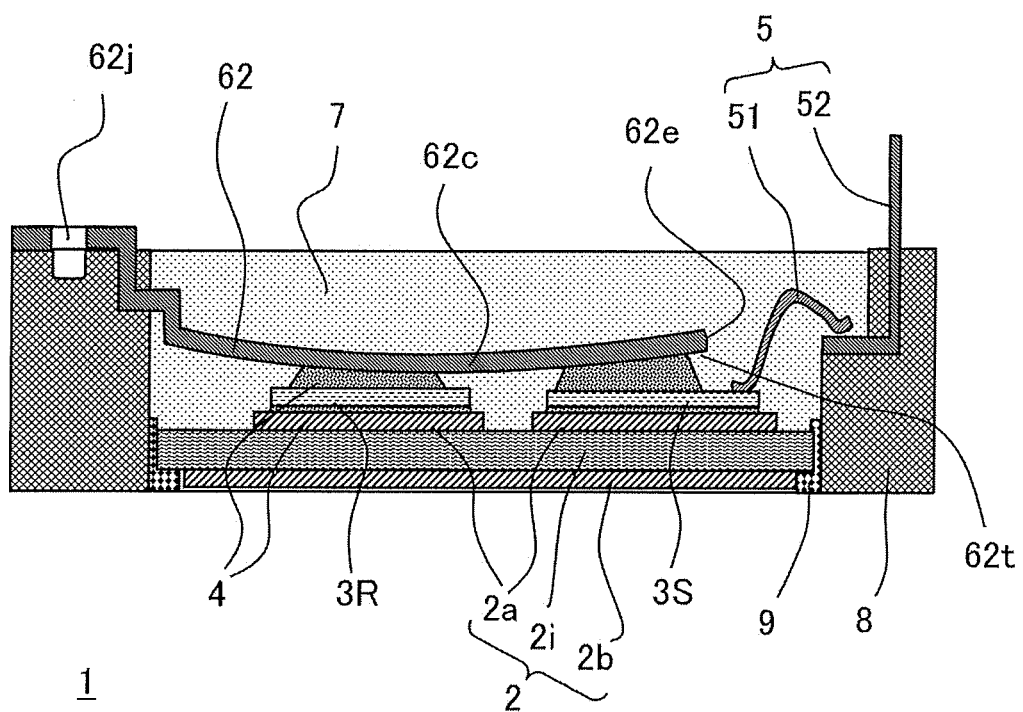
FIG. 6 is a cross-sectional view for illustrating a configuration of a semiconductor device for electric power according to Embodiment 2 of the invention.

In contrast to the semiconductor device for electric power described in Embodiment 1, in a semiconductor device for electric power according to Embodiment 2, the form of the lead terminal is changed. FIG. 6 is for illustrating a configuration of the semiconductor device for electric power according to Embodiment 2 of the invention, which is a cross-sectional view corresponding to A-A line in FIG. 1A used in Embodiment 1. In Embodiment 2, the configuration other than the lead terminal is similar to that described in Embodiment 1 including the modified examples, so that its description is omitted here. Further, in the figure, with respect to the objects equivalent to those described in Embodiment 1, the same reference numerals are given thereto, so that detailed description is omitted for numerally overlapping objects.

Also in the semiconductor device for electric power 1 according to Embodiment 2, as shown in FIG. 6, the semiconductor elements for electric power 3 are die-bonded (joined) using the solder 4, to the conductive layer 2a of the ceramic board 2 that is a circuit board.

As the ceramic board 2, a ceramic base member 2i of 40 mm×25 mm×0.635 mm thick, which is made of aluminum nitride and on both sides of which copper conductive layers 2a, 2b each 0.4 mm thick are formed, is used. The semiconductor elements for electric power 3 are elements using SiC that is a wide bandgap semiconductor material, and used here are: the IGBT (Insulated Gate Bipolar Transistor) 3S that is 0.25 mm thick and forms a rectangular-plate shape of 15 mm square, as a switching element; and the diode 3R that is 0.25 mm thick and forms a rectangular-plate shape of 15 mm×15 mm, as a rectifier element.

One end-side portion of the electrode terminal 62 which is a feature of this invention is bonded to, among the respective main electrodes of the semiconductor elements for electric power 3, the front-side main electrodes (3a, 3e) including the emitter electrode 3e of the IGBT 3S. Further, the lead terminal 61 made of a copper plate of 8 mm wide×0.7 mm thick is bonded, using the solder 4, onto the conductive layer 2a to which back-side electrodes of the respective elements including the collector electrode 3c of the IGBT 3S are bonded.

The ceramic board 2 is positioned and fixed inside the casing 8 made of a PPS (Poly Phenylene Sulfide) resin of 48 mm×28 mm×12 mm high, using the adhesive agent 9 made of silicone so that a gap between the casing and the portion of the ceramic base member 2i is filled therewith. Note that the lead terminal 61, the lead terminal 62 and the signal terminals 52 are each formed by insert molding in the casing 8, and the terminal parts 61j, 62j of the lead terminal 61 and the lead terminal 62, each having a width of 10 mm and exposed from an upper portion of the casing 8 (left-upper portion in the figure), are each provided as a screw terminal. Further, one end portion (width: 1.5 mm) of the signal terminal 52 is electrically connected in the casing 8 to the gate electrode 3g, as a control electrode, of the IGBT 3S by means of a bonding wire 51 (made of aluminum: (1) 0.15 mm), and the other end portion in a pin shape is exposed from an upper portion of the casing 8 (right-upper portion in the figure).

Accordingly, the main current circuit 6 between the semiconductor elements for electric power 3 and an external circuit is formed by the lead terminal 61 and the lead terminal 62. Further, the gate electrode 3g of the IGBT 3S and the like, form the signal circuit 5 connected to the outside, by means of the signal terminals 52 and the bonding wires 51. Further, similarly as described in Embodiment 1, the inside of the casing 8 is sealed in an insulated manner by filling a resin (sealing member 7) therein by direct potting and then curing it by heating. Note that the linear expansion coefficient of the sealing member 7 is adjusted to be an intermediate value between the linear expansion coefficient of the lead terminal 62 and the linear expansion coefficient of the ceramic board 2.

Here, the lead terminal 62 of the semiconductor device for electric power 1 according to Embodiment 2 is curved (a curved portion 62c is formed) so that both of its longitudinal ends are farther from the ceramic board 2 than its center portion and the lead terminal forms a downwardly convex shape over the region including its bonded portion to the elements. Because of the formation of the curved portion 62c, a portion near the end 62e becomes farther from the ceramic board 2 and the semiconductor device for electric power 3 as it becomes closer to the end 62e. Namely, with respect to the surface in the lead terminal 62, facing to the semiconductor element for electric power 3 or the ceramic board 2, its part that is sealed by the sealing member 7 inside the casing 8 and is placed near the end 62e, is formed as an inclined surface 62t which is inclined to become farther from the semiconductor element for electric power 3 or the ceramic board 2 as it becomes closer to the end 62e.

Accordingly, also in the semiconductor device for electric power 1 according to Embodiment 2, it is possible to mitigate the occurrence of the beginning point of breakage from concentrating to the portion bordering on the end 62e, and as a result, to extend the lifetime until the breakage. Meanwhile, a configuration of providing the bent portion 62b and a configuration of changing the wall thickness, that are described in Embodiment 1, and a curved configuration over the region including the bonded portion to the elements, that is described in Embodiment 2, may be combined as appropriate.

Note that, in Embodiment 2, although a case has been shown where the sealing member 7 is formed by potting a resin in the casing 8, this is not limitative. For example, like the modified example in Embodiment 1, without using the casing, a sealing member may be formed by transfer molding using an unshown mold.

As described above, in accordance with the semiconductor device for electric power 1 according to Embodiment 2, it is also possible to easily form the inclined surface 62t in such a manner that the portion of the lead terminal 62 (curved portion 62c), facing to the ceramic board 2 and including its part bonded to the semiconductor elements for electric power 3 (or their electrodes), is configured to be curved.

Note that in each of the above embodiments, a case has been described where SiC, that is a wide bandgap semiconductor material, is used for the semiconductor element for electric power 3; however, as a matter of course, the invention can also be applied to a usual element using silicon. Notwithstanding, a particularly remarkable effect emerges when a so-called wide bandgap semiconductor material is used that is wider in bandgap than silicon and is represented not only by SiC, but also a gallium nitride (GaN)-based material, diamond, or the like, in the case where an allowable amount of current is large and a high-temperature operation is expected. This is because the thickness (cross-sectional area) required for the lead terminal 62 becomes thicker and thus the rigidity becomes higher, and further the operation temperature becomes higher, so that a displacement due to the difference in linear expansion coefficient becomes larger.

Thus, it is possible to more exert such an effect that the occurrence of the beginning point of breakage is mitigated from concentrating to the portion bordering on the end 62e, and as a result, the life time until the breakage is extended, by the formation of the inclined surface 62t on the lead terminal 62, which is inclined to become farther from the semiconductor element for electric power 3 or the ceramic board 2 as it becomes closer to the end 62e. Namely, when the configuration of the lead terminal 62 according to each embodiments of the invention is used, it becomes possible to achieve a high-performance semiconductor device for electric power 1 which takes advantage of the characteristic of a wide bandgap semiconductor material.

DESCRIPTION OF REFERENCE NUMERALS AND SIGNS

1: semiconductor device for electric power, 2: ceramic board (circuit board), 2a, 2b: conductive layer, 2i: ceramic base member, 3: semiconductor element for electric power, 4: solder (bonded portion), 5: signal circuit, 6: main current circuit, 7: sealing member, 8: casing, 9: adhesive agent, 61: lead terminal, 62: lead terminal, 62c: curved portion, 62e: end, 62f: planar portion, 62t: inclined surface.

The invention claimed is:

1. A semiconductor device for electric power, comprising:
   a circuit board;
   a semiconductor element for electric power having a first surface on which an electrode is formed and a second surface bonded to the circuit board;
   a lead terminal having a first longitudinal end bonded to the electrode, and a second longitudinal end configured to be electrically connected externally of the semiconductor device; and
   a sealing member by which the semiconductor element for electric power is sealed together with the lead terminal bonded to the electrode;
   wherein, the first longitudinal end of the lead terminal is formed which becomes farther from the circuit board as it becomes closer to the terminal portion of the first longitudinal end;
   wherein, the lead terminal has a thickness between a first side facing in a direction of the circuit board and a second side facing in an opposite direction that becomes thinner up to the terminal portion of the first longitudinal end.

2. The semiconductor device for electric power according to claim 1, wherein a base member of the circuit board is formed of a ceramic.

3. The semiconductor device for electric power according to claim 1, wherein the lead terminal is formed of a copper plate.

4. The semiconductor device for electric power according to claim 1, wherein the semiconductor element for electric power is formed of a wide bandgap semiconductor material.

5. The semiconductor device for electric power according to claim 4, wherein the wide bandgap semiconductor material is silicon carbide, a gallium nitride-based material or diamond.

* * * * *